United States Patent [19]

Trittschuh, III et al.

[11] Patent Number: 5,321,585
[45] Date of Patent: Jun. 14, 1994

[54] DIRECTLY SOLDERABLE AUXILIARY CIRCUIT BOARD ASSEMBLY AND METHODS OF MAKING AND USING THE SAME

[75] Inventors: Everett P. Trittschuh, III, Lewisburg; Roger A. Kaywood, Dayton, both of Ohio

[73] Assignee: General Motors Corporation, Detroit, Mich.

[21] Appl. No.: 904,080

[22] Filed: Jun. 25, 1992

[51] Int. Cl.[5] .................... H05K 1/11; H05K 3/00; H01R 23/70
[52] U.S. Cl. .................... 361/784; 361/792; 361/761; 29/829; 29/832; 29/837; 174/261; 439/65; 439/83; 439/629; 439/630; 439/631
[58] Field of Search .......... 361/412, 413, 414, 415, 361/760, 761; 29/829, 830, 831, 832, 837, 846, 852; 174/250, 255, 260, 261; 439/65, 66, 78, 83, 626, 629, 630, 631, 632, 636, 637

[56] References Cited

U.S. PATENT DOCUMENTS

| | | | |
|---|---|---|---|
| 2,894,241 | 7/1959 | McKee | 439/65 |
| 3,997,226 | 12/1976 | Lang et al. | 439/377 |
| 4,193,108 | 3/1980 | Romano | 361/399 |
| 4,445,740 | 5/1984 | Wallace | 439/152 |
| 4,513,064 | 4/1985 | Marcus | 361/412 |
| 4,619,368 | 10/1986 | Kappelt, Jr. | 211/41 |
| 4,753,005 | 6/1988 | Hasircoglu | 29/829 |
| 4,831,278 | 5/1989 | Ueda et al. | 307/10.1 |
| 4,831,456 | 5/1989 | Takamura | 358/229 |
| 4,838,798 | 6/1989 | Evans et al. | 439/61 |
| 4,855,873 | 8/1989 | Bhargava et al. | 361/424 |
| 4,862,293 | 8/1989 | Saito et al. | 360/35.1 |
| 4,894,022 | 1/1990 | Guckenheimer | 439/260 |
| 4,907,976 | 3/1990 | Killcommons | 439/72 |
| 4,934,943 | 6/1990 | Klein et al. | 439/65 |
| 4,992,908 | 2/1991 | Solomon | 361/400 |
| 5,002,498 | 3/1991 | Takahashi | 439/326 |
| 5,025,307 | 6/1991 | Ueda et al. | 257/696 |

FOREIGN PATENT DOCUMENTS

| | | | |
|---|---|---|---|
| 0206132 | 8/1979 | Fed. Rep. of Germany | 439/65 |
| 0161792 | 6/1990 | Japan | 439/65 |

Primary Examiner—Leo P. Picard
Assistant Examiner—Bot Ledinh
Attorney, Agent, or Firm—Cary W. Brooks

[57] ABSTRACT

Disclosed is a directly solderable circuit board assembly including a main circuit board directly connected to an auxiliary circuit board without the use of interfacing terminals. The main circuit board has a slot formed therein and the auxiliary circuit board has a projection which is received in the slot of the main circuit board. Conductive pads are formed on both circuit boards at substantially right angles adjacent the intersection of the two circuit boards. A solder fillet is formed bridging the copper pads on each circuit board to provide electrical and mechanical connection.

4 Claims, 3 Drawing Sheets

DIRECTLY SOLDERABLE AUXILIARY CIRCUIT BOARD ASSEMBLY AND METHODS OF MAKING AND USING THE SAME

FIELD OF THE INVENTION

This invention relates to a main circuit board and an auxiliary circuit board assembly which are directly soldered together without the use of interfacing terminals.

BACKGROUND OF THE INVENTION

Many structures provide an electrical connection between a main circuit board and an auxiliary circuit board in fixed relationship with each other. However, such constructions utilize interfacing terminals which are expensive and require numerous steps to attach the interfacing terminals to the boards. Thus, it would be desirable to have a method of connecting an auxiliary circuit board to a main circuit board in fixed relationship to each other without the use of interfacing terminals and which is inexpensive, easy to assemble and provides a sturdy structure. Further, it would be desirable to have a method of attaching an auxiliary board to a main circuit board which is confined from expansion, in the same plane, by a housing.

SUMMARY OF THE INVENTION

The present invention includes a main circuit T board which has an auxiliary board directly connected thereto without the use of interfacing terminals. The auxiliary circuit board has a projection which is received in a slot formed in the main circuit board. Coincident copper pads are provided on the main circuit board and the auxiliary circuit board at or near right angles to each other at the intersection of the two circuit boards. A solder fillet is formed bridging a copper pad on the main circuit board and a copper pad on the auxiliary circuit board thereby making an electrical and mechanical connection. The soldering is preferably accomplished by wave soldering. In an alternative embodiment, the slot in the main circuit board has a slight arch, and the auxiliary board projection is substantially planar. Thus, there is a substantial frictional fit as the planar projection of the auxiliary circuit board is inserted into the slightly arched slot of the main circuit board. Another embodiment includes an additional support bracket attached to the second circuit board to provide support against side loading and initial alignment.

These and other objects, features and advantages would become apparent from the following brief description of the drawings, detailed description, and appended claims and drawings.

DETAILED DESCRIPTION OF THE DRAWINGS

Figure 1:
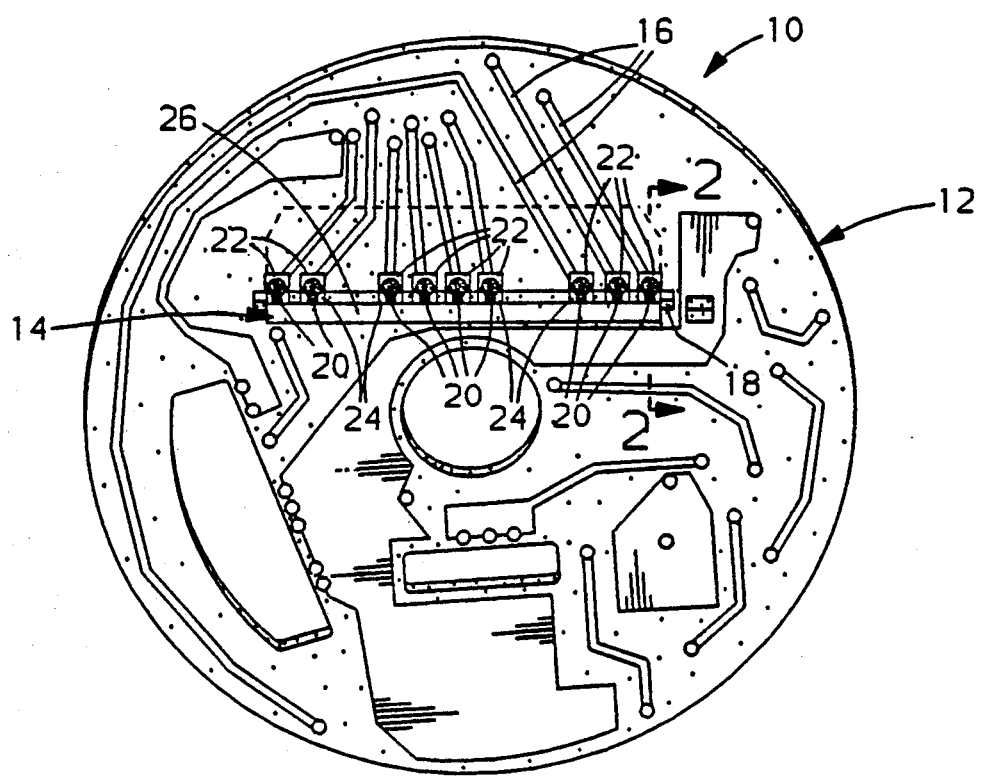
FIG. 1 is a perspective view of a directly solderable first and second circuit board assembly according to the present invention.
Figure 2:
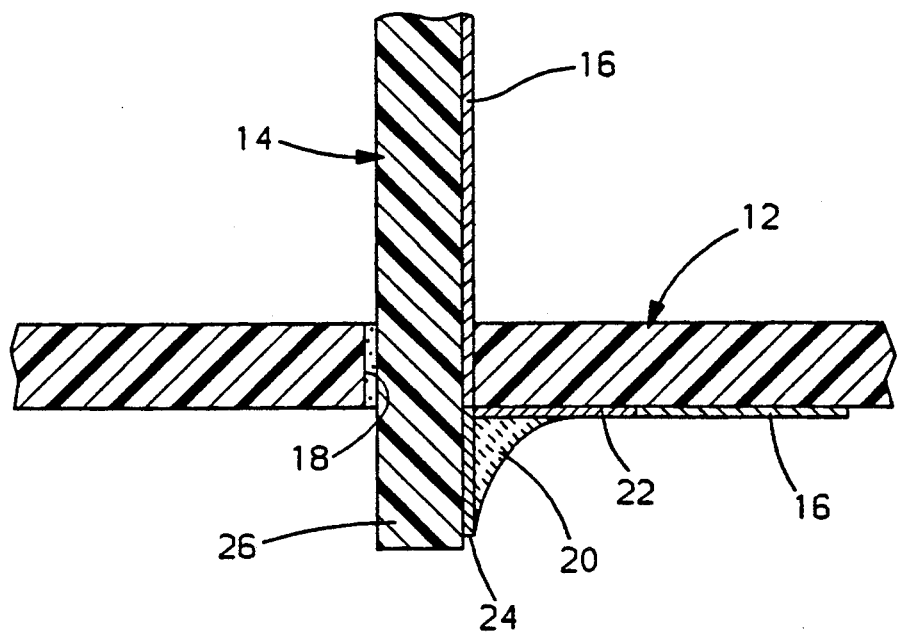
FIG. 2 is an enlarged view along line 2—2 of FIG. 1.

FIG. 1 illustrates in perspective view a directly solderable first 12 and second circuit board 14 assembly 10 according to the present invention. A first circuit board 12 may have a variety of electrical components thereon and include a conductive pattern forming an electric circuit. Conductive runners 16 extend from the electric circuit toward a slot 18 formed in the first circuit board. As shown in FIG. 2, immediately adjacent the slot are conductive pads 22 on the first circuit board. The second circuit board is similarly formed and may include a variety of electrical components thereon. A conductive pattern is formed on the circuit board to define an electronic circuit. Conductive runners 16 extend from the electronic circuit towards a projection 26 extending outwardly from the second circuit board. Copper pads 24 are formed near the edge of the projection of the second circuit board. The projection 26 of the second circuit board is received in the slot of the first circuit board such that the conductive pads 22 on the first circuit board aligned with the conductive pads on the second circuit board. A solder fillet 20 is formed bridging a conductive pad 22 on the first circuit board with the conductive pad 24 on the second circuit board thereby making electrical and mechanical connection. The solder fillet may be formed by conventional methods known to those skilled in the art and is preferably formed by wave soldering. The conductive pad on the first circuit board is formed on the bottom surface and is connected to the electronic circuit as described above.

With respect to FIG. 2, it is possible to form a circuit on both sides of the auxiliary circuit board 26. A brushless blower motor utilizes this feature. Components and solder fillets are placed on both sides of the circuit board in a manner similar to that described with respect to FIG. 2. Further, solder fillets can be placed on both sides of the circuit board to provide additional stability for the auxiliary board even if components are only on one side of the circuit board.

Figure 3:
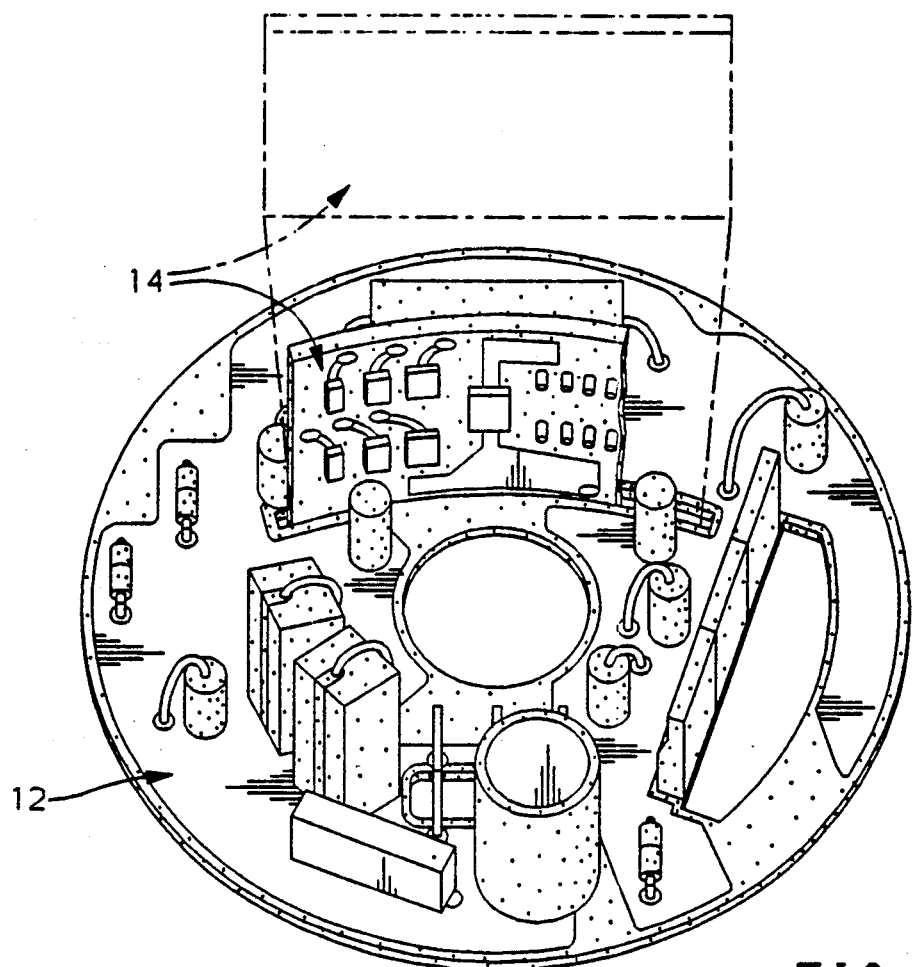
FIG. 3 is a top view of a first circuit board having an arched slot therein according to the present invention.

As illustrated in FIG. 3, the first circuit board 12 may have an arched slot formed therein such that a planar projection of the second circuit board 14 will fit snugly in the arched slot of the first circuit board. The second circuit board 14 in FIG. 3 is shown with an exaggerated curvature. Actually, the second circuit board is curved only at or near its intersection with the first board so as to produce a frictional fit in the slot. The remainder of the second circuit board is substantially planar shaped. Preferably, the slot is formed slightly larger than the width and length of the projection on the second circuit board.

Figure 4:
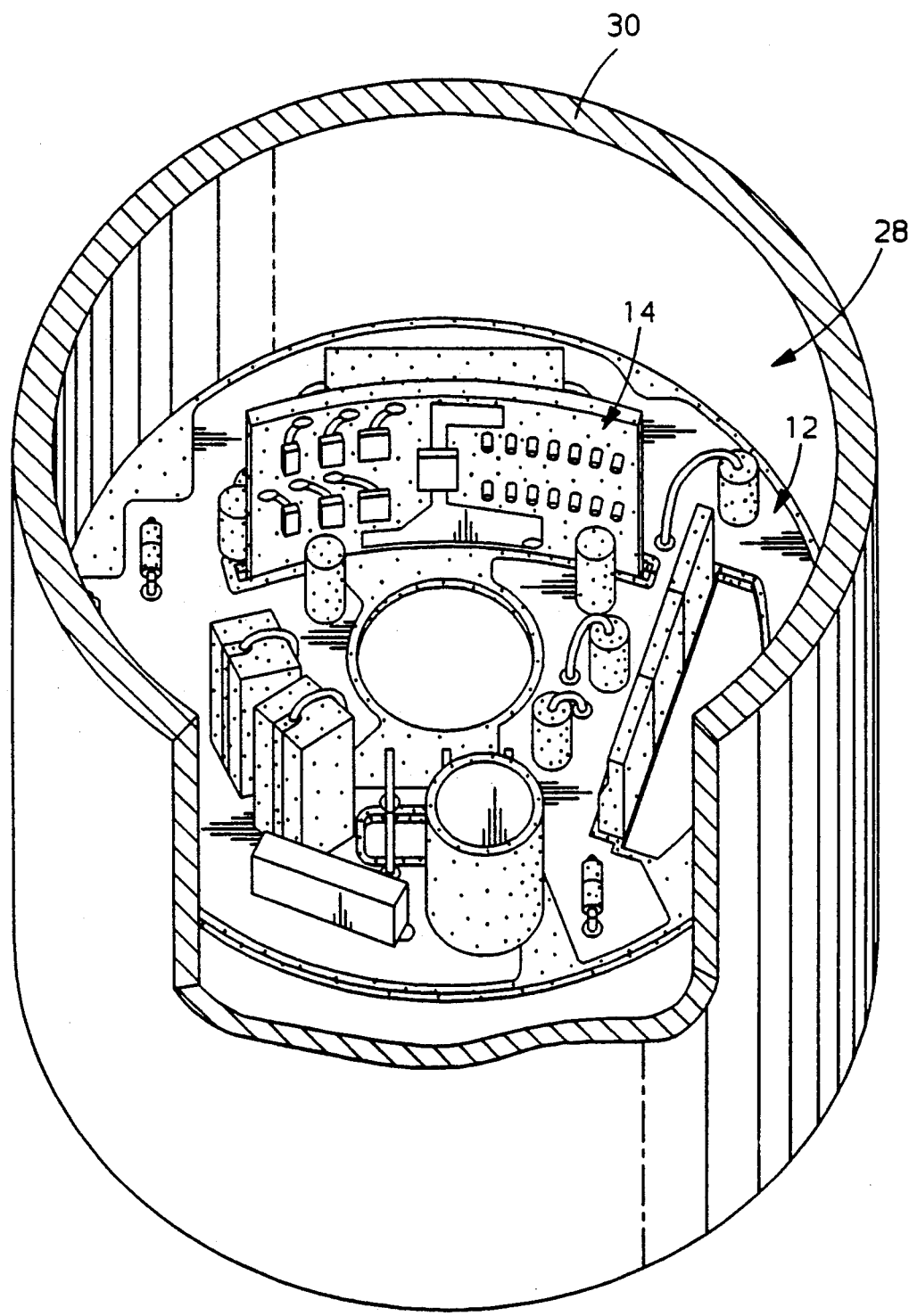
FIG. 4 is a perspective view with portions broken away of a blower motor control device having a directly solderable first and second circuit board assembly received in a cylindrical housing according to the present invention.

FIG. 4 is a perspective view with portions broken away of a brushless blower motor control device 28 having a directly solderable first 12 and second circuit board 14 assembly received in a cylindrical housing 30 according to the present invention. According to the present invention, the circuit real estate may be expanded for an existing device having a housing such as that illustrated in FIG. 4 and wherein the main circuit board 12 is confined from further expansion in its plane by such a housing. The present invention allows for the use of such a housing without having to redesign the housing to accommodate the increased electronic circuit real estate. To expand the circuit real estate of such a device, the main circuit board is formed to include a slot as described above. A second circuit board is formed including a projection portion as described above and received in the slot of the first circuit board such that the first and second circuit boards are at substantially right angles to each other. Thus, the circuit real estate may be expanded for such a device without requiring redesign of the device and its housing.

It will be apparent that the present invention allows an auxiliary circuit board to increase the amount of usable surface to mount components, but does not increase the size of the main circuit board. This allows for complex designs to be fitted into areas where they would not have previously fit.

Figure 5:
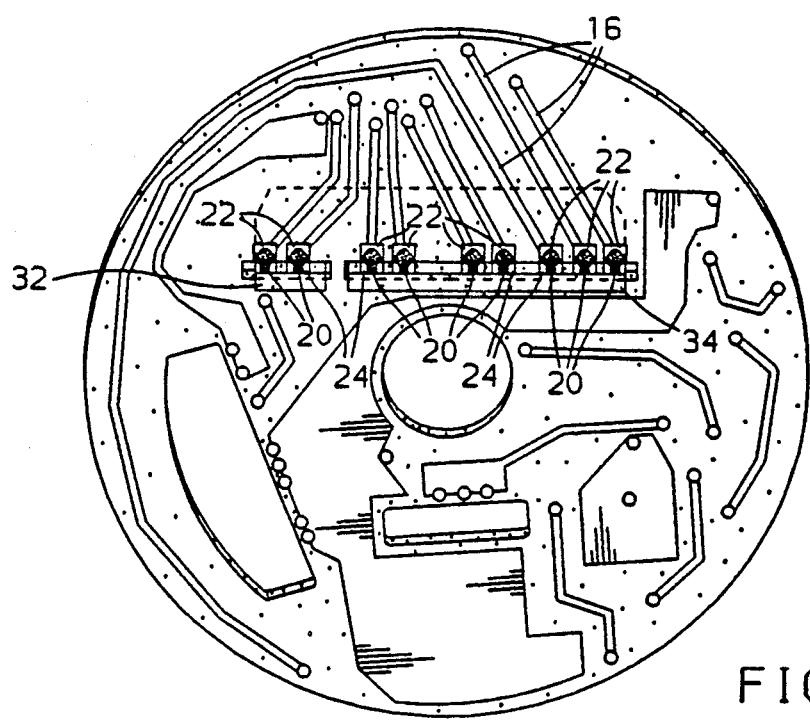
FIG. 5 is a perspective view of a directly solderable first and second circuit board assembly having first and second projections extending from a circuit board according to the present invention.

In an alternative embodiment illustrated in FIG. 5, a second projection 32 of a size different from the first projection 34 may extend from the second circuit board. This will prevent reverse orientation of the second circuit board during the assembly process.

We claim:

1. A directly solderable circuit board assembly comprising a first circuit board having a first electronic circuit pattern formed on said first circuit board, and a first slot formed in said first circuit board, a first set of at least six conductive pads formed adjacent to said first slot in said first conductive circuit board, and a conductive runner extending from each of the conductive pads of the first set to said first electronic circuit pattern;

a second circuit board having a second electronic circuit pattern formed on a first surface of said second circuit board, said second circuit board including a first projection having a planar rectangular shape and extending outwardly from said second circuit board and having an outer edge, a second set of at least six conductive pads formed on said first surface adjacent the outer edge of said first projection and a conductive runner extending from each of said conductive pads on said first surface to said second electronic circuit pattern;

said first projection received in said first slot formed in said first circuit board such that each conductive pad of the first set aligns with a corresponding conductive pad of the second set;

a wave solver fillet formed on aligned conductive pads of the first set and second sets to make an electrical and mechanical connection between the first and second circuit boards;

wherein said first circuit board further comprises a second slot having a shorter length than said first slot, and wherein said second circuit board further comprises a second projection having a planar rectangular shape and having a length shorter than said first projection and wherein said second projection is received in said second slot;

wherein said second projection has a conductive pad formed on a surface thereof and a conductive runner extending from the conductive pad on the second projection to said second circuit pattern on said second circuit board, said first circuit board having a conductive pad formed adjacent said second slot and a conductive runner extending from the conductive pad adjacent the second slot to said circuit pattern on said first circuit board, and a wave solder fillet formed on the conductive pad of the second projection and on the conductive pad adjacent the second slot;

wherein said first slot in said first circuit board is arched.

2. A directly solderable circuit board assembly as set forth in claim 1 wherein said first and second circuit boards are at right angles to each other.

3. A method of expanding circuit real estate in a device having a first circuit board received in a housing of a device so that housing walls are immediately adjacent edges of the first circuit board to limit expansion of the first circuit board in the direction of its planar surface, comprising:

forming a first slot and a second slot in the first circuit board wherein said second slot has a length shorter than the first slot, and said first slot is arched;

forming a first set of at least six conductive pads immediately adjacent said first slot in the first circuit board, and forming a conductive pad adjacent the second slot;

forming a conductive runner extending from each of the conductive pads of the first set and from the conductive pad adjacent the second slot to a first electronic circuit pattern formed on a planar surface of said first circuit board;

providing a second circuit board having a second electronic circuit pattern formed on a planar surface, said second circuit board having a first and second projection, each having a planar rectangular shape and having an outer edge extending from said second circuit board, said first projection having a length longer than said second projection, and a second set of at least six conductive pads formed adjacent an outer edge of said first projection, and a conductive pad formed adjacent the second projection, and a conductive lead extending from each of the conductive pads to said second electronic circuit pattern on said second circuit board;

inserting the first and second projection of said second circuit board into the first and second slots respectively of said first circuit board so that conductive pads of the first set are aligned with conductive pads of the second set, and the conductive pad adjacent the second projection is aligned with the conductive pad adjacent the second slot; and wave soldering the aligned conductive pads.

4. An electronic device comprising:

a directly solderable circuit board assembly comprising a first planar circuit board having outer edges and having a first electronic circuit pattern formed on said first circuit board, and a first slot formed in said first circuit board, a first set of at least six conductive pads formed adjacent to said first slot in said first conductive circuit board, and a conductive runner extending from each of the conductive pads of the first set to said first electronic circuit pattern;

a second circuit board having a second electronic circuit pattern formed on a first surface of said second circuit board, said second circuit board including a first projection having a planar rectangular shape and extending outwardly from said second circuit board and having an outer edge, a second set of at least six conductive pads formed on said first surface adjacent the outer edge of said first projection and a conductive runner extending from each of said conductive pads on said first surface to said second electronic circuit pattern;

said first projection received in said first slot formed in said first circuit board such that each conductive pad of the first set aligns with a corresponding conductive pad of the second set;

a wave solder fillet formed on aligned conductive pads of the first set and second sets to make an electrical and mechanical connection between the first and second circuit boards;

wherein said first circuit board further comprises a second slot having a shorter length than said first slot, and wherein said second circuit board further comprises a second projection having a planar rectangular shape and having a length shorter than said first projection and wherein said second projection is received in said second slot;

wherein said second projection has a conductive pad formed on a surface thereof and a conductive runner extending from the conductive pad on the second projection to said second circuit pattern on said second circuit board, said first circuit board having a conductive pad formed adjacent said second slot and a conductive runner extending from the conductive pad adjacent the second slot to said circuit pattern on said first circuit board, and a wave solder fillet formed on the conductive pad of the second projection and on the conductive pad adjacent the second slot;

wherein said first slot in said first circuit board is arched, and further comprising a housing immediately adjacent to and surrounding the outer edges of the first circuit board.

* * * * *